United States Patent [19]
Iyer et al.

[11] Patent Number: 5,424,732
[45] Date of Patent: Jun. 13, 1995

[54] TRANSMISSION COMPATIBILITY USING CUSTOM COMPRESSION METHOD AND HAREWARE

[75] Inventors: Balakrishna R. Iyer, San Jose, Calif.; Teresa A. Meriwether, Cary, N.C.; Elton B. Sherwin, Jr., Stamford, Conn.; Bhaskar Sinha, Poughkeepsie, N.Y.

[73] Assignee: International Business Machines Corporation, Armonk, N.Y.

[21] Appl. No.: 193,307

[22] Filed: Feb. 8, 1994

Related U.S. Application Data

[63] Continuation-in-part of Ser. No. 985,409, Dec. 4, 1992, Pat. No. 5,323,155.

[51] Int. Cl.$^6$ .............................................. H03M 7/30
[52] U.S. Cl. ........................................ 341/51; 341/67
[58] Field of Search ........................... 341/51, 67, 106

[56] References Cited

U.S. PATENT DOCUMENTS

| | | | |
|---|---|---|---|
| 4,814,746 | 3/1989 | Miller et al. | 341/95 |
| 4,847,619 | 7/1989 | Kato et al. | 341/106 |
| 4,881,075 | 11/1989 | Weng | 341/87 |
| 4,988,998 | 1/1991 | O'Brien | 341/55 |
| 5,045,852 | 9/1991 | Mitchell et al. | 341/51 |
| 5,136,289 | 8/1992 | Yoshida et al. | 341/67 |
| 5,153,591 | 10/1992 | Clark | 341/51 |
| 5,175,543 | 12/1992 | Lantz | 341/51 |
| 5,270,712 | 12/1993 | Iyer et al. | 341/50 |

OTHER PUBLICATIONS

*Enterprise Systems Architecture*/390, "Data Compression", International Business Machines Corporation, SA22-7208-00, Jun. 1993.

*Primary Examiner*—Marc S. Hoff
*Attorney, Agent, or Firm*—Bernard M. Goldman

[57] ABSTRACT

Describes novel methods for compressing data character strings into "storage optimized indices" (SOIs) and stores their adaptive Ziv Lempel (AZL) indices, called "evolution based indices" (EBIs), in fields in corresponding entries in a SOI dictionary. The method also compresses data using the SOI dictionary, which accesses the corresponding EBIs for representing the compressed data. The EBIs are put into storage, or transmitted to a receiving location. Greater data compression processing efficiency is obtained by using the SOI dictionary than is available using prior types of AZL dictionaries. The disclosure further describes methods for decompressing EBI indices into corresponding phrases at a receiving location using either a conventional AZL dictionary or a SOI dictionary after translating received EBIs into SOIs. Also described is a submethod for phrase length determination for use in the decompression process. Using this phrase length detection, received phrases are decompressed in their reverse character order through a buffer, or directly in a target storage area, or in a combination of the latter two techniques. The phrase length may be stored in corresponding dictionary entries to avoid a length tracing process in the invention.

8 Claims, 9 Drawing Sheets

FIG. 4

```
INDEX   PHRASE
  0       A
  1       B
  2       C
  3       CA
  4       AC
  5       CB
  6       BC
  7       CC
```

FIG. 5

```
PHRASE      ROOT     ij

A       CHILD_1    ---
  B       CHILD_2    --|---
  C       CHILD_3    --|--|---
  AC      CHILD_11   <--  |  |
  BC      CHILD_21   <-----  |
  CA      CHILD_31   <--------
  CB      CHILD_32
  CC      Child_33
```

FIG. 6

```
POSITION
INDEX      SYMBOL
           ROOT
  0          A  ---
  1          B  --|----
  2          C  --|---|----
  3          C  <--    |   |
  4          C  <------    |
  5          A  <----------
  6          B
  7          C
```

FIG. 7

| STORAGE OPTIMIZED INDEX | PHRASE |
|---|---|
| 0 | A |
| 1 | B |
| 2 | C |
| 3 | AC |
| 4 | BC |
| 5 | CA |
| 6 | CB |
| 7 | CC |

FIG. 8A

| STORAGE OPTIMIZED INDEX | EVOLUTION BASED INDEX |
|---|---|
| 0 | 0 |
| 1 | 1 |
| 2 | 2 |
| 3 | 4 |
| 4 | 6 |
| 5 | 3 |
| 6 | 5 |
| 7 | 7 |

FIG. 8B

10: FREEZE AZL DICTIONARY
    ↓
11: CREATE SOI DICTIONARY FROM FROZEN AZL DICTIONARY KEEPING TRACK OF EBIs AND PHRASE LENGTHs SKIP THE SD ENTRIES IN THE SOI DICTIONARY
    ↓
12: CREATE EBI FIELD IN EACH SOI ENTRY
    ↓
13: CREATE PHRASE LENGTH FIELD (LGTH) IN EACH SOI ENTRY EXCEPT FOR THE SIBLING-DESCRIPTOR ENTRIES

FIG. 9

| POSITION INDEX | SYMBOL | | EVOLUTION BASED INDEX |
|---|---|---|---|
| | ROOT | | |
| 0 | A | ---- | 0 |
| 1 | B | ---\|--- | 1 |
| 2 | C | ---\|--\|--- | 2 |
| 3 | C | <---   \|  \| | 4 |
| 4 | C | <------   \| | 6 |
| 5 | A | <--------- | 3 |
| 6 | B | | 5 |
| 7 | C | | 7 |

FIG. 10

| POSITION INDEX | SYMBOL | | CHILDREN |
|---|---|---|---|
| | ROOT | | |
| 0 | A | ---- | C |
| 1 | B | ---\|--- | C |
| 2 | C | ---\|--\|--- | A B C |
| 3 | C | <---   \|  \| | NONE |
| 4 | C | <------   \| | NONE |
| 5 | A | <--------- | NONE |
| 6 | B | | NONE |
| 7 | C | | NONE |

FIG. 11

| POSITION INDEX | SYMBOL | CHILDREN |
|---|---|---|
| | ROOT | |
| 0 | A ---- | C |
| 1 | B ---\|--- | C |
| 2 | C ---\|--\|--- | A B |
| 3 | \| \| \| | C |
| 4 | C <--- \| \| | NONE |
| 5 | C <------ \| | NONE |
| 6 | A <--------- | NONE |
| 7 | B | NONE |
| 8 | C | NONE |

FIG. 12

| INDEX | PHRASE |
|---|---|
| 0 | A |
| 1 | B |
| 2 | C |
| 3 | NONE |
| 4 | AC |
| 5 | BC |
| 6 | CA |
| 7 | CB |
| 8 | CC |

FIG. 13

| POSITION INDEX | SHORT INDEX |
|---|---|
| 0 | 0 |
| 1 | 1 |
| 2 | 2 |
| 3 | NONE |
| 4 | 3 |
| 5 | 4 |
| 6 | 5 |
| 7 | 6 |
| 8 | 7 |

FIG. 14

| POSITION INDEX | EVOLUTION BASED INDEX |
|---|---|
| 0 | 0 |
| 1 | 1 |
| 2 | 2 |
| 3 | NONE |
| 4 | 4 |
| 5 | 6 |
| 6 | 3 |
| 7 | 5 |
| 8 | 7 |

```
21: DETERMINE SOI FOR THE PHRASE
              |
              v
22: IF SOI IS AN SD ENTRY THEN ERROR --> EXIT
              | N                        Y
              v
23: DETERMINE EBI CORRESPONDING TO THE SOI
    FROM THE EBI FIELD IN ENTRY
              |
              v
24: OUTPUT EBI AS THE COMPRESSED FORM FOR THAT PHRASE
```

TRANSMISSION COMPATIBILITY USING CUSTOM COMPRESSION METHOD AND HAREWARE

The subject application is a continuation-in-part of prior filed application Ser. No. 07/985,409, filed on Dec. 4, 1992, U.S. Pat. No. 5,323,155 and the subject application claims the filing date of that prior application for all matters in the prior application in common with the subject application.

INCORPORATION BY REFERENCE

This specification incorporates by reference the specifications of the following prior-filed patent applications:

U.S. application Ser. No. 07/968,631, filed Oct. 29, 1992 entitled "Method and Means Providing Static Dictionary For Compressing Character Data and Expanding Compressed Data", assigned to the same assignee as the subject application. This describes and claims a unique dictionary structure for performance optimized compression process.

U.S. application Ser. No. 07/985,409, filed Dec. 4, 1992 entitled "Semi-Static Data Compression/Expansion Method", assigned to the same assignee as the subject application. This describes and claims novel mechanisms to enable an adaptive Ziv-Lempel (AZL) compression dictionary to be frozen, when mature, and transformed into a static dictionary to provide semi-static dictionary operations.

U.S. Pat. No. 4,814,746 to Miller and Wegman which is assigned to the same assignee as the subject application. It describes and claims an adaptive (dynamic) Ziv-Lempel compression dictionary structure which uses a replacement technique for adapting a Ziv-Lempel (adaptive ZL) compression dictionary to a new data file (i.e. string of data characters).

INTRODUCTION

This invention describes a mechanism to compress data using performance optimized dictionary structures described in application Ser. No. 07/968,631 and generating compressed output which is the same as if the data is compressed with the well-known Ziv-Lempel algorithm. This enables the use of performance optimized custom hardware to compress the data and still generate compressed data that may be recognized and expanded by the Ziv-Lempel algorithm implementation.

This invention also describes mechanisms to quickly decode and expand the compressed data using this performance optimized Ziv-Lempel dictionary.

BACKGROUND

The Ziv-Lempel (ZL) data compression algorithm is organized around a translation table, referred to here as a dictionary, which is a set of fields stored in a memory of a data processing system. The dictionary maps a variable-length string of input characters (referred to as a "phrase") into a fixed length code (referred to as index). The compression/decompression method may operated in either of two well-known ways: using a Adaptive Ziv-Lempel (AZL) algorithm, or using a Static Ziv-Lempel (SZL) algorithm. For AZL compression operation, at any instant in time, the dictionary contains phrases that have been encountered previously in a message being compressed. At any time for AZL, the dictionary consists of a running sample of phrases in the message, so the available phrases reflect the statistics of the message. For SZL compression, the operation is the same, except that there is no updating of the dictionary.

AZL dictionary structures are well-known in the prior art, in which the adaptive dictionary is uniquely generated for each input data file to enable the compression and expansion of the file. These adaptive dictionaries are built while compressing or expanding the data, and are tailored to each respective data file. When the data to be compressed consists of a small number of atomic symbols (bytes), there is little compression obtained from an AZL method because very little about the data can be learned from a small amount of data. The only resource is to use the knowledge about the data before starting the compression process.

Processor performance may be significantly increased by using a static dictionary and the SZL process taught in application Ser. No. 07/968,631, which teaches a novel performance-improving dictionary structure generated from the records in a large database. This SZL dictionary does not adapt to the record being currently compressed for transmission or storage. SZL dictionaries are located at both transmitting and receiving locations, and they need not be transmitted with the data. At the source of the transmission, the dictionary is used for compression. The compressed data is then transmitted to the destination, where a copy of the same dictionary is used to expand the compressed data. Thus, the speed of transmission is significantly improved as only the compressed data needs to be transmitted.

Each entry in a dictionary represents a character string (phrase), and if the phrase in the message to be compressed is the same as the phrase represented by a dictionary entry, the compressed form for the phrase is the dictionary entry number, referred to as the index. Hence, the compressed data consists of a sequence of indices, which are transmitted. At the other end of the transmission, each received index is expanded into the phrase it represents.

The AZL and the SZL process where the dictionary is not updated are prior methods. The compressed codes generated from these processes are recognizable and decodable by vendors and their software packages that conform to these methods. These prior compressed codes consist of a concatenation of AZL indices, referred to as Evolution-Based-Index (EBI). Indices generated using the optimized dictionary structure of application Ser. No. 07/968,631 are referred to as Storage-Optimized-Index (SOI). Also, IBM document "ESA/390 Data Compression" (form number SA22-7208 00) describes programs for converting from SOI to EBI compressed indices (compressed data). Compressed data consisting of SOIs are not recognizable over a network by available software packages that conform to commercial adaptive AZL processes, because compressed data using SOIs are different from compressed data using EBIs.

SUMMARY OF THE INVENTION

This invention describes an improved method of implementing the well-known Ziv-Lempel algorithm for compressing data to improve performance, while maintaining compatibility with prior adaptive Ziv-Lempel output. Databases need to compress small records, and the data in the overall compressed database changes very slowly over a long period of time. These databases would be served best by a static dictionary that changes infrequently, since this static dictionary enables high performance by not requiring updates of the dictionary. On the other hand, network access methods must have very frequent updates to the dictionary in order to be able to compress changing data. This invention describes a method to use a single set of hardware/software to accommodate both requirements in an optimum manner.

Prior network access methods use AZL compression algorithm to reduce network traffic. An AZL dictionary is initialized for a session, and this dictionary is updated continuously during the life of the session. The receiving partner at the other end of the session expands the compressed data, and this receiver may be any product that conforms to the AZL algorithm. It is essential that the dictionaries kept by both the parties (sender and the receiver) remain identical throughout the session or else successful expansion will not occur. Application Ser. No. 07/985,409 teaches a way to improve the performance of this process by using AZL in a semi-static mode, where the sender (the party compressing the data) freezes the dictionary when the dictionary is mature, and sends the information to the receiving end. This enables the receiver to also freeze the dictionary in the process. So far, all the transmitted indices (the transmitted compressed data is a concatenation of indices) are the adaptive AZL Evolution Based Indices (EBIs). To further improve performance and use the implementation of the Static ZL algorithm taught in application Ser. No. 07/968,631, the frozen AZL dictionary is translated to the novel SZL structure in Ser. No. 07/968,631; and the system uses this dictionary instead of the frozen AZL dictionary to compress the data. This process of using the unique static optimized dictionary generates Storage Optimized Indices (SOIs) which are different from the EBIs. The subject invention teaches a mechanism to generate the adaptive AZL EBIs using the unique SZL dictionary to improve the performance of the local data processing system to maintain the data sent over the network as adaptive AZL EBIs so that the receiver of the compressed data need not understand SOIs and may be an adaptive expansion algorithm conforming to the AZL algorithm.

The invention provides a method in which each SOI dictionary entry, except sibling entries, is structured to contain a field for storing a corresponding EBI index. An EBI index may occupy a smaller space (fewer bits) than would be required to store a corresponding SOI index, since usually more SOI indices are required than EBI indices in a dictionary, due to the AZL process not using sibling entries, which are used in the SOI process.

Hence with this invention, only the transmitter/compressor needs to convert from SOI indices to EBI indices. Any receiver/decompressor has the option either: of using the received EBI indices with an adaptive AZL dictionary (such as when the receiver has no knowledge of SOI to EBI conversion), or of using EBI to SOI conversion to gain processing efficiency.

This invention also improves the expansion process for the ZL algorithm. During expansion of received indices, the phrases represented by the indices are decompressed with characters in a reverse order (backwards), and the length of each phrase is not known until decoding the phrase is complete. That is, the number and position of decompressed characters in a phrase's restored character string cannot be determined until the entire phrase has been decompressed. Methods are described in this invention addressing the manner of handling phrase characters during decompression. One solution is to decode each phrase in a buffer, and then move the phrase to a target area. This requires a large predefined static buffer means which is capable of storing the largest phrase that can be contained in the expansion dictionary. Improvements to this method are provided by this invention and claimed herein.

Further, the invention provides a method in which SOI dictionary entries may be structured to contain fields containing the length for its represented SOI phrase (as well as a corresponding EBI index). The phrase size field can aid the decompression process to make it more efficient by making known the size of each phrase from its received EBI before the phrase is decompressed, among other options provided by this invention in the handling of phrase decompression in a target area. The invention also provides a tracing sub-method for use in decompression to determine phrase length which can be used to determine where the phrase is to be stored while it is being decompressed.

SUMMARY OF THE DRAWINGS

FIG. 4 illustrates the index to phrase relationship for this example. Each entry in the dictionary is an index and represents a specific phrase. These indices are the EBIs.

FIG. 5 shows a different dictionary structure using storage optimized indices (SOIs). The use of SOIs improves processor performance. In the structure of a SOI dictionary, all the children of a node are placed together in consecutive locations.

FIG. 6 shows SOI indices associated with an SOI dictionary layout.

FIG. 7 illustrates the index to phrase relationship for a SOI dictionary layout. Each index locates an entry in the dictionary and represents a specific phrase. These indices are the SOIs. Note the difference between these indices and the EBI indices in FIG. 4.

FIG. 8A shows the relationship between the SOIs and the EBIs in an example. The SOIs are generated by an implementation of the SZL algorithm, whereas EBIs are generated by the well-known AZL algorithm.

FIG. 8B shows a flow diagram explaining the process of creating the SOI dictionary with the new fields in each entry to keep track of the corresponding EBIs and also the phrase lengths.

FIG. 9 shows a SOI dictionary layout, including EBIs in the entries, to further optimize performance by avoiding memory accesses.

FIG. 10 shows an extension of the SOI dictionary described in application Ser. No. 07/968,631 (PO9-91-053).

FIGS. 11 illustrates the case where children fields in an entry are sparse. Here in this example, only two children spaces are available. The solution is to use the next entry, displacing the rest of the dictionary entries following by one, as shown in this Figure.

FIG. 12 shows the index to phrase relationship for the example in FIG. 11. Note that SOI 3 does not represent any phrase, and hence the number of entries in the dictionary is increased by one.

FIG. 13 illustrates an index translation mechanism where compatibility is an issue and the compressed data needs to be decodable by a adaptive AZL implementation. Here the SOIs are translated to 'short-indices' to reduce the size of the compressed data and to keep the compressed data compatible.

FIG. 14 illustrates the final SOI to EBI translation table. This enables the use of optimized compression hardware for generating SOIs, and staying compatible over the network by translating these SOIs to EBIs as part of the compression process.

DESCRIPTION OF THE DETAILED EMBODIMENT

Figure 1:
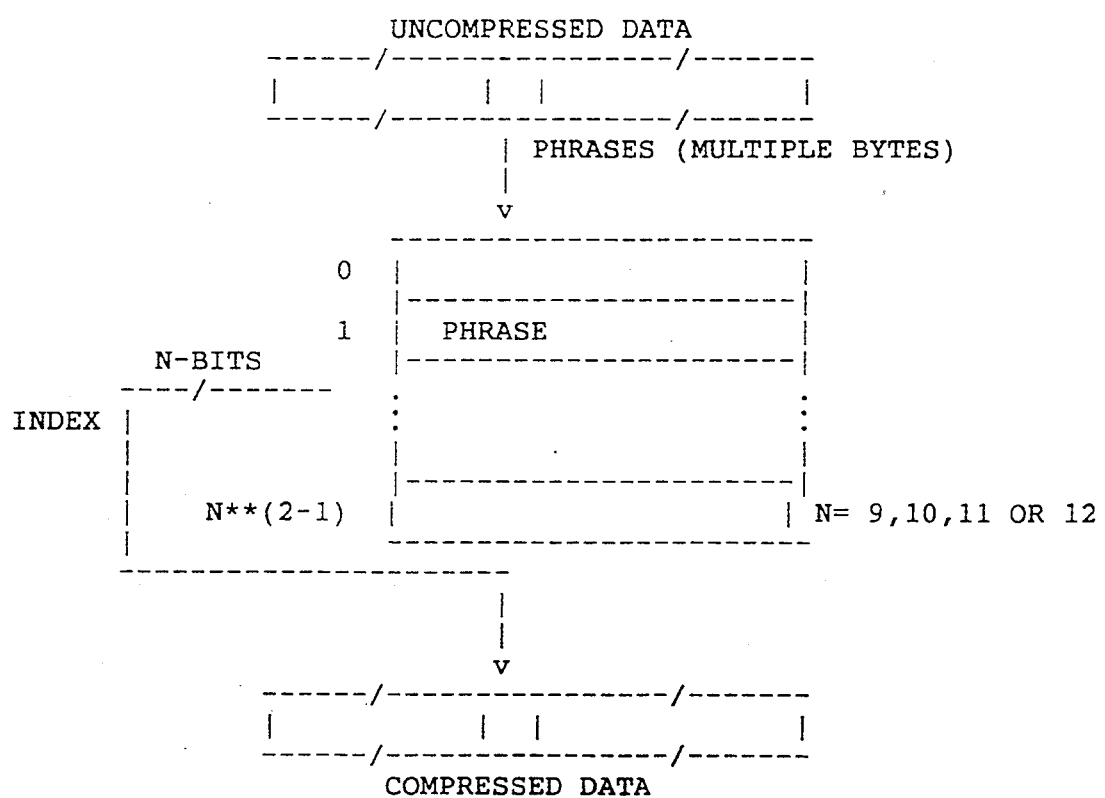
FIG. 1 illustrates the ZL process, adaptive or static. Input phrase is matched with the dictionary entries. If a match is found, the phrase is coded as the entry number in the dictionary (index). Index size ranging from 9–12 bits are common. The output compressed data is a concatenation of indices, each representing a phrase of the input uncompressed data. If the dictionary entries are updated after each phrase lookup, compression process is adaptive, and the algorithm is AZL. If the dictionary is not updated, the process is static, and the algorithm is SZL.

This invention is a further improvement to the prior dictionary structure described in application Ser. No. 07/968,631 which provides methods of implementing the well-known Ziv-Lempel algorithm for compressing data to improve its performance in a data processing system. That method makes a first pass over the database to be compressed to sample some or all of the records in creating a static Ziv-Lempel (SZL) dictionary as defined in application Ser. No. 07/968,631. That SZL dictionary is modified by this invention before being used to compress or expand records by methods described herein. The subject invention obtains transmission compatibility for compressed records by enabling an SZL dictionary to output adaptive AZL indices, while maintaining the performance improvements of using a SZL dictionary.

Compressed small records need to be individually transmitted. The SZL dictionary takes advantage of an observation that large data bases, comprised of many small records, change percentage-wise very slowly over a long period of time. These slowly changing databases are served best by SZL dictionaries that are changed infrequently, which improves system performance since no processing is needed for updating SZL dictionaries, unlike AZL dictionaries which require continuous processing to continuously update the AZL dictionaries.

A counter-balancing factor is that the SZL dictionary requires more entries than a corresponding AZL dictionary for the same data, due to having sibling entries not found in AZL dictionaries. The resulting compressed data, represented by the dictionary indices, may require the SZL process to sometimes use one more bit per index representation than the AZL process. Whether an extra bit is required by the SZL process depends on whether the extra sibling entries cause the total number of entries in the SZL dictionary to exceed the next power of two, compared to the number of entries in the corresponding AZL dictionary.

Therefore, use of the AZL method may result in better transmission efficiency (e.g. smaller indices), while the SZL method results in better system processing efficiency. This invention enables both of these advantages to be used in its ZL implementations, i.e. SZL system processing that outputs AZL index transmission for representing the compressed data. This preferred embodiment methods provide a single set of supporting hardware/software that transmits AZL indices using an SZL dictionary (that internally uses SOI indices).

Application Ser. No. 07/985,409 teaches a way to improve the performance of a process using the ZL algorithm in a semi-static mode, where the sender (the party compressing the data) cause the freezing of all dictionaries in the network when they are mature, by sending a freeze signal to each receiver to synchronize the freezing at all locations in the network. This enables all locations (sending and receiving) to stop updating their dictionaries at the same point. So far, all indices in the network are AZL indices (herein called Evolution Based Indices, EBIs).

Then the preferred embodiment converts at least the frozen AZL dictionary at the sending location into the optimized SZL structure using the implementation of the SZL algorithm taught in application Ser. No. 07/968,631 to at least improve the system performance at the sending location. The sender then internally switches over to using Storage Optimized Indices(-SOIs) in its internal SZL process. Furthermore, the preferred embodiment enables the SZL process to output EBI indices (i.e. conventional AZL indices), which continue to be transmitted to all receiving locations in the network.

After the AZL dictionaries are frozen at the receivers, the receivers may or may not convert to the preferred SZL dictionary structure, at the option of each receiver. Therefore, any receiving location need not know of the conversion to the SZL process by the transmitting location in order to continue receiving the compressed data in an AZL form, regardless of whether it has converted or not. Thus, some receivers may optionally convert to SZL processing to internally improve performance, while other receivers in the same network may not convert and continue using AZL processing.

SOIs are different from the EBIs. This embodiment provides a method to generate adaptive EBIs using the SOI hardware, such that the data transmitted over the network remains the adaptive AZL EBIs so that the receivers of the compressed data need not understand SOIs and may continue data decompression using the conventional adaptive AZL expansion algorithm.

Figure 2:
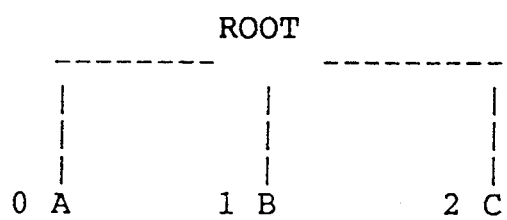
FIG. 2 illustrates an eight node tree. This is an example with three symbol alphabet <A,B,C>, and this tree is created with the AZL algorithm when the input string is CACBCC.

An example is provided in the Figures to enable a better understanding of the preferred method of providing EBI indices in a performance optimized SZL dictionary. This example uses a three symbol (character) alphabet (A, B and C) that supports an eight node tree which is shown in FIG. 2. A hardware dictionary layout is shown in FIG. 1 to explain the index incompatibility between the EBI and SOI indices. This problem is explained due to sibling descriptors taking up index space in the SZL dictionary, and then the preferred method is described to solve this problem with index translation table. A conversion table is shown for explaining how the EBI/SOI index incompatibility is resolved.

FIG. 1 shows an adaptive ZL dictionary, implementing either the static or dynamic ZL method. A sequence of characters from a record are inputted to the dictionary, which parses them into phrases (strings) in the conventionally ZL manner by detecting character mismatches that provide parsing signals which define the phrases in a record. The inputted characters of each phrase obtain matches against dictionary entries when they are compared by a processor. A character mismatch is found when a next character is not in the search path being followed for the current phrase, which indicates the start of the next phrase in the record. The dictionary entry number (index) of the last matching character in a phrase is outputted from the dictionary as the compressed form of the phrase, which may be part of a data transmission of the record.

Commonly, the outputted index size is in the range of 9-12 bits for representing each phrase index; but theoretically more bits may be used to represent each index. Using more bits per index reduces the compression effect, and may cause efficiency problems in storing compressed records in hardware storage or for transmission operations.

FIG. 2 shows the 3 symbol alphabet tree example primed with the alphabet A, B, C shown at the first level, i, in the tree. The AZL process build an AZL dictionary (like that in shown FIG. 1) until the tree grows to 8 nodes (8 dictionary entries), and then the dictionary is then frozen. Initially, the tree in FIG. 2 is represented in the dictionary by three entries at indices 0, 1, 2.

Figure 3:
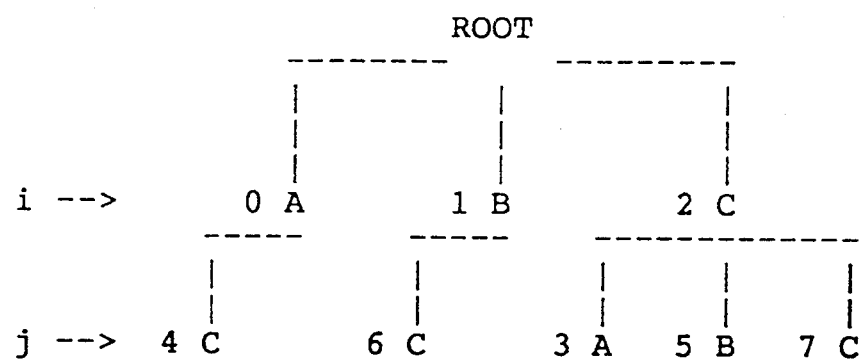
FIG. 3 illustrates the node labelling of FIG. 2, using the AZL algorithm. The dictionary is primed with the alphabets A, B, and C. Each node represents an entry in the dictionary, in this example, there are eight entries.

FIG. 3 represents a tree developed from an input string, CACBCCAACBCABBCACC. This tree is created by the conventional ZL method by a first section of the string, CACBCC initially starting with the three node tree of FIG. 2. The tree is frozen when it has 8 nodes—represented by 8 entries generated in the dictionary of FIG. 1. The rest of the string, AACBCABBCACC, is then compressed using the frozen dictionary, represented in FIG. 3.

In more detail, the generation of the tree of FIG. 3 involves: a match by the first character C in entry 2. The next character A mismatches because it is not in the initial table in FIG. 2. A new entry 3 is generated in the dictionary to represent the path CA. Next, a new search is started at the root of the tree for the mismatched character A, which matches in entry 0. Then the next character C mismatches because it is not then in the table, and a new entry 4 is generated representing its path AC. C starts a new search from the root and matches an entry 2. Then the next character B mismatches because it is not in the table, and a new entry 5 is generated representing its path CB. B starts a new search from the root and matches in entry 1, but its next character C mismatches and entry 6 is generated in the dictionary. The next search finds C in entry 2 and mismatches on its next character C, and entry 7 is generated for the path CC. Then starting at the root, character C matches in entry 2 and its following character A matches on entry 3 (a child of C) but a mismatch occurs on the next character A, since there is no path CCA in the tree. However, the tree and its dictionary are frozen at this time with 8 entries (8 nodes), and all subsequent characters in any string must be tested against this 8 entry dictionary.

The alphabet nodes A, B, and C as children of the root at level i in the tree. The nodes representing paths AC, BC, CA, CB, CC are at level j in the tree. Each node at level j is a child of a node at level i in the tree. FIG. 3 shows ZL node and entry labelling based on EBI indexing. Each node in FIG. 3 represents a respective one of these eight phrases, A, B, C, AC, BC, CA, CB, CC.

The first three entries in the dictionary are the primed alphabet entries at tree level i, which are located in the dictionary at indices equal to sequentially coded values for these characters, beginning with index 0. The next five entries at tree level j follow in the dictionary, occupying consecutive spaces in storage in the order they are generated.

FIG. 4 relates the indices in the dictionary of FIG. 1 to the nodes in the tree of FIG. 3 for the represented phrases corresponding to each entry.

String (AACBCABBCACC) is encoded after the tree is frozen by parsing its phrases as: A, AC, BC, A, B, BC, AC, C. This generates the Evolution Based Indices (EBIs) as 0, 4, 6, 0, 1, 6, 4, 2.

In order to improve processing performance, it is desirable to place all child entries of a node together. This motivates the use of the SOI dictionary structure layout of the tree generically as shown in FIG. 5 (read childij: as child j of child i of root). The notation in FIG. 5 is that the child nodes are at the same level in the tree, level i or level j in FIG. 3, counting from left to right and starting with 1 as the leftmost node. At level i: 1 is A, 2 is B, and 3 is C. At level j: 1 is C, 2 is C, 3 is A, 4 is B, and 5 is C. For example, 3 1 represents C C (C is a child of C) in FIG. 5.

When the index is defined as the position of a dictionary entry, then there is no need to use any more storage to store indices. This is the method used in the dictionary structure. In the dictionary and tree example of FIGS. 1 and 3, the dictionary storage layout and indices associated with this layout are shown in FIG. 6. These indices are referred to as Storage Optimized Indices (SOIs). The mapping between SOI indices, and the phrases stored in the dictionary is different from the mapping for the adaptive AZL indices. This mapping for SOIs is shown in FIG. 7. Note that the phrases corresponding to indices are different between the relationships in FIG. 4 and FIG. 7.

Continuing with the same example of the string AACBCABBCACC, the substring after the tree is filled as described previously. Its parsing remains the same A, AC, BC, A, B, BC, AC, C. The storage optimized indices (generated by the optimized dictionary) are 0, 3, 4, 0, 1, 4, 3, 2. These are different from the corresponding EBIs. Network access methods can communicate with a compression program that only decodes EBI indices and can not handle SOIs.

This embodiment exploits the one-to-one mapping between storage optimized SOI and non-optimized EBI indices, shown in FIG. 8A, where each SOI index created by the dictionary has a one-to-one relationship with the corresponding EBI index, which is the adaptive AZL index, recognized today by all parties using the conventional ZL algorithm. The embodiment generates SOI indices and translates them to EBI indices. Using an index translation table, such as in FIG. 8A, the coded SOIs are: 0, 3, 4, 0, 1, 4, 3, 2 which translate to 0, 4, 6, 0, 1, 6, 4, 2, thus obtaining compatibility between the AZL software compression method that can not handle indices in the optimized SOI dictionary structure.

The network access method of this invention starts generating an AZL dictionary for compressing the session data. When the AZL dictionary becomes mature, i.e. adapted to session data characteristics, the access method freezes the dictionary so that no more entry updates take place. This method is represented in FIG. 8B, in which step 10 freezes the dictionary (in the manner described in application Ser. No. 07/985,409. Next step 11 creates the compression SOI dictionary by converting the frozen AZL dictionary into a SOI dictionary.

The conversion of EBI to SOI entries for the SOI dictionary by step 11 involves recognizing all child entries in the AZL dictionary that are siblings. Thus, entries at the same tree level, e.g. at level i or j, etc., are siblings. A SOI sibling entry is generated for each of the identified siblings, and put into a sibling list of all siblings at the same tree level (i.e. having the same parent entry). Each sibling list is located as a contiguous set of entries in the SOI dictionary, and a pointer is put in their common parent entry for locating the start of the sibling list.

Step 12 in FIG. 8B creates a new EBI field in each SOI entry in the SOI dictionary. A corresponding AZL index value is stored in the EBI field in the SOI entry. A corresponding relationship exists between an EBI and a SOI when both are represented by the same node in the AZL tree. No EBI index is stored in any of the sibling entries, because sibling entries do not have corresponding EBI indices in the frozen AZL dictionary; this is explained later herein. Thus, each SOI entry except a sibling entry contains a corresponding EBI.

Step 13 also creates a new phrase length field (LGTH) for the phrase represented by that entry in the SOI dictionary.

FIGS. 9 and 10 show and compare the relationships between EBIs and SOIs, and show how child entries are located as sibling entries. FIG. 9 and 10 illustrate a SOI position index for each entry in the SOI dictionary, and also illustrate a symbol for each entry which is the extension character in the respective entry. The extension character ends a path in the associated tree, and that path is the phrase represented by that entry. FIG. 9 also correlates an EBI (Evolution Based Index) for each corresponding SOI entry, as determined in the tree in FIG. 2.

To improve processor efficiency, the children characters of a parent node character are stored in contiguous SOI dictionary entries of the parent node entry (this avoids a storage access to the child node entries). Thus node 0 represents phrase A which has child C, and child phrase AC is represented by the SOI node 3. Similarly, node 2 represents phrase C which has child entries A, B, and C (called children), and these phrases are represented by SOIs 5, 6, and 7 respectively in FIGS. 9 and 10.

To generate the SOIs and then translate them to EBIs would take memory accesses to get to an index translation table. To optimize encoding performance (which is a requirement for compressing small database records, and in general to save processor resources), this invention provides a method that stores and encodes the EBIs in the SOI dictionary itself as represented in FIG. 9.

Each entry in the dictionary corresponds to a SOI, which is the position in the dictionary of the entry. These SOI indices cannot be sent over a network because they may not be recognized by all receivers, as they are not the conventional EBI indices. Hence, each SOI dictionary entry contains the corresponding EBI, and instead of coding the phrase as the dictionary position (as is conventionally done), this invention instead codes the phrase by the content of an EBI field in the SOI entry containing the EBI.

In a SOI dictionary a special kind of entry, called a sibling descriptor, is placed within a child list for each node entry containing a sibling character corresponding to siblings of the same parent entry, as described in application Ser. No. 07/968,631. These sibling descriptors occupy dictionary index positions that would otherwise be available to contain a child entry. The purpose of an sibling descriptor is to compensate for a lack of room in a parent entry to contain all children characters of that parent node, or a lack of room in a preceding sibling entry to contain the sibling characters.

In the FIG. 9 and 10 example, nodes A and B have one child each whereas node C has three children. This information is contained in the parent entry shown in FIG. 10. Note that the usage of the child field is sparse. If, for example, the entry has space only for two children, a problem arises for the entry in dictionary position 2. The dictionary structure, as defined, uses the next entry, displacing the rest of the dictionary entries following by one as shown in FIG. 11. Not all position indices in the dictionary map to valid phrases. SOIs 0, 1, and 2 represent the alphabet characters A, B, and C, and SOIs 4-8 represent the phrases as shown in FIG. 12. SOI 3 is a sibling descriptor entry and may be mapped to any phrase. In this manner, a method is described for mapping SOIs to EBIs. Then this method is used to more efficiently access EBIs in a SOI dictionary so that the EBI indices can be sent as conventionally compressed data over a network in the conventional adaptive AZL form.

Continuing with the example of the string AACB-CABBCACC (the substring after the tree is filled): its parsing remains the same: A, AC, BC, A, B, BC, AC, C. But they have new position indices in FIGS. 11 and 12 which are the SOIs actually generated for the dictionary (which are 0, 4, 5, 0, 1, 5, 4, 2). Note that each index ranges from 0 to 8. These SOIs cannot be represented by 3 bits per index as is possible with the corresponding EBIs. That is, 4 bits are required to represent each of the eight SOI indices, which degrades compression performance as each phrase now would be encoded in a bigger size (4 bits per phrase, instead of 3 bits per phrase). To solve this problem this invention provides two solutions. First, it reduces the number of indices by one, in other words, it prunes enough tree nodes so that indices range from 0 to the next lowest power of 2 (this is possible for databases where compatibility is not always an issue). The pruned tree nodes must be the least popular ones, where the exact algorithm may vary (these algorithms are not part of this invention and hence not discussed here in any detail).

Thus, the loss of compression can be contained and ought to be much less than what would be lost by increasing the size of each index by one bit. However, for network transmission methods, this is not a solution, because of code incompatibility; the other party connected to a network and involved in communications may be totally unaware of the codes and special dictionary structure restrictions. This invention provides a second solution. This solution is to use a translation table to translate the position indices (range 0–8) to "short indices" in a range (0–7) as shown in the FIG. 13 translation table. In this example, position indices can be translated to short indices using the table in FIG. 13. The encoding of the string AACBCABBCACC by position indices 0, 4, 5, 0, 1, 5, 4, 2 translates into the short indices 0, 3, 4, 0, 1, 4, 3, 2. These can be translated to EBIs through the translation table that translates SOIs to EBIs given earlier. The EBIs generated through the translation would be 0, 4, 6, 0, 1, 6, 4, 2.

The two translation tables may be combined into one which will translate the position index directly to the evolution based index without the intermediate step. For this example, the table to translate position indices to evolution based indices is shown in FIG. 14.

Figures 15A, 15B:
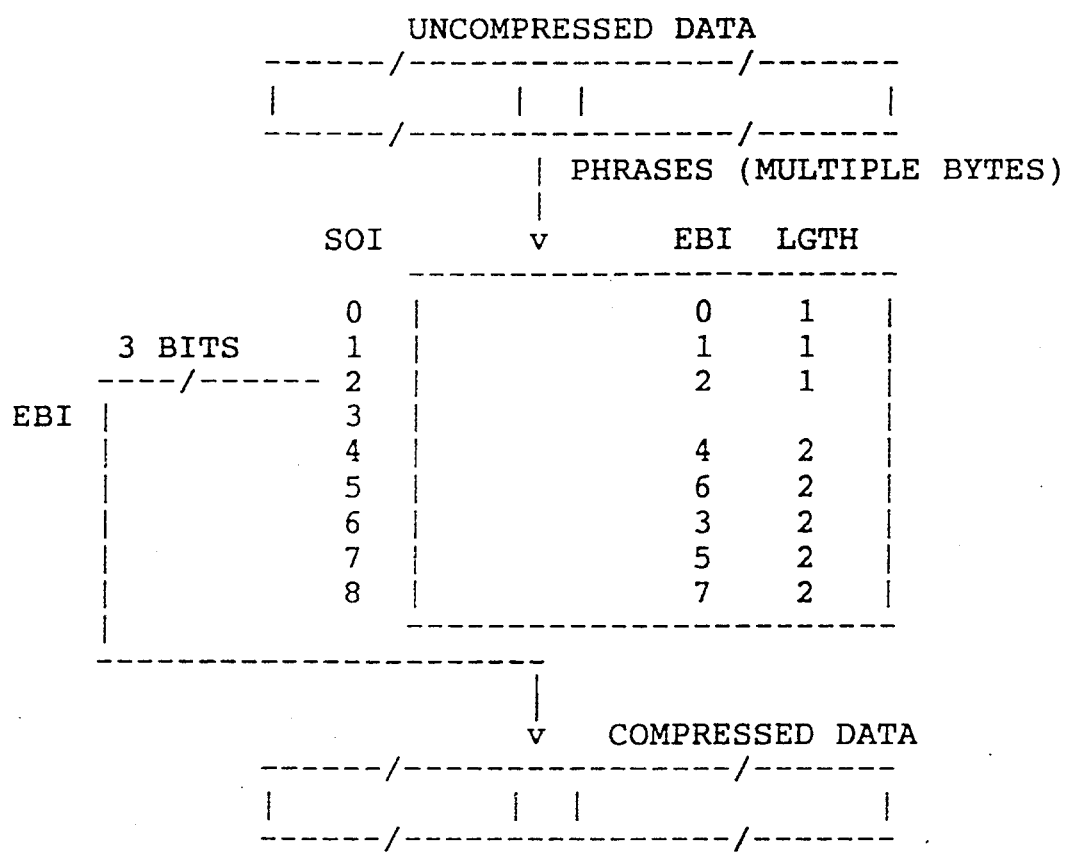
FIG. 15A illustrates a compression process using the unique SOI dictionary which contain a corresponding EBI value field and a phrase length (LGTH) field in each SOI entry, except SOI sibling entries.
FIG. 15B illustrates a flow diagram explaining the process of creating the SOI dictionary and then converting it to the corresponding EBI from the information in the entry.

FIG. 15A shows an example of a SOI dictionary provided by this invention, that contains the EBIs of the AZL tree described in FIG. 2. Nine SOI entries are created having SOI indices numbered 0–8. Each SOI index locates an SOI entry which contains two new fields, one is the EBI field for containing the corresponding EBI for that SOI, and the other field is for containing a phrase length (LGTH) for indicating the size of the phrase represented by that entry. Note that the EBIs range from 0–7 and may be represented by 3 bits, whereas the SOIs range from 0–8 and need 4 bits to be represented.

The method shown in FIG. 15B uses the dictionary in FIG. 15A with a transmitter in a network to control data compression by a network access method. It processes each phrase of data from an input stream of uncompressed data characters using an SOI dictionary of the type in FIG. 15A to generate EBI output indices using the process in FIG. 15B. The advantage of the SOI dictionary in FIG. 15A over the prior SOI dictionary in FIG. 1 is that the dictionary in FIG. 15A cannot output EBI indices.

Step 21 in FIG. 15B receives and processes each input phrase in a uncompressed record being inputted for compressed transmission. The inputted phrase operates in the previously known manner in the SOI dictionary to determine and locate the SOI entry representing that phrase in the dictionary. Next step 22 examines the accessed SOI entry by looking at an indicator therein for any indication that the entry is a sibling descriptor (SD) type of SOI entry. If step 22 finds it is an SD entry, an error condition exists and the yes exit is taken to exception-handling software to end the current data compression operation and handle the error condition. If step 22 does not find any SD indication, the no exit is taken to step 23. Step 23 accesses the EBI field in the accessed entry and obtains the EBI value therein. Then step 24 outputs and transmits that EBI value as the compressed form of the current phrase to the receivers in the network.

Then the process in FIG. 15B repeats for any next phrase in the input record, but does not repeat if the current phrase is the last phrase of the record.

This EBI and the other EBIs found for the other phrases (taken sequentially in the received uncompressed record) comprise the compressed form for that record, which is sent over the network to conform to the well-known AZL algorithm, which is recognized by all receivers in the network. Thus for example, the compression of the string AACBCABBCACC by position indices 0, 4, 5, 0, 1, 5, 4, 2 is directly converted into the EBI sequence 0, 4, 6, 0, 1, 6, 4, 2.

At each receiver, the characters are decoded from each EBI index in the EBI dictionary at each receiver. These characters for each EBI are decoded in a backwards sequence, compared to their order in their original uncompressed record. Furthermore, the number of characters (length) of each phrase being decoded is not known until after the decoding is complete. In prior decompression means, the position of each character in the decoded record cannot be determined at the start of decoding. Four methods are disclosed in this invention addressing this issue.

The first method decodes the phrase in a buffer, and move decoded phrase into the target area. This requires a large predefined buffer which is capable of storing the largest phrase that can be contained in an expansion dictionary. After each phrase is decoded in its reverse order in the EBI dictionary and all of its characters is recorded in the buffer, the characters in the buffer are readout in their correct order and written in a target area contiguously from the last character of the last decoded phrase recorded therein.

The second method traces (simulates) the decode process in the receiver's EBI dictionary to find the string length. This is done by decoding the phrase in the dictionary, but without outputting any characters (by walking up the tree), and instead counting each character being decoded to determine the number of characters in the reverse sequence for the current phrase. Once the character count is determined, it is used to determine a position in a target area, at which the characters can again be decode in the dictionary and outputted in reverse order without a risk of destroying any part of the prior decoded part of the current record and having the last decoded character located next to the last character of the last received EBI for the current record. Thus in the second pass in the dictionary for the EBI, its decoded characters are outputted to the target area in which they are recorded in their reverse order with the result that their characters are in the correct order and contiguous in the recorded uncompressed record in the target area.

The second method's dual decode operation in the dictionary may have adverse performance implications due to the fact that each phrase decode operation is performed twice in the EBI dictionary.

The third method provides a small buffer into which most of the phrases, but not necessarily long phrases, can be decoded. The third method uses a buffer like that used in the first method, but detects if the buffer becomes full, and a next character in the phrase would overflow the buffer. If the phrase fits in the buffer without overflow, the first method is used in which the characters in the buffer are readout in their correct order and written in a target area contiguously from the last character of the last decoded phrase recorded therein—and no second decode the EBI dictionary is done for this EBI. But if the buffer is found to need to overflow, a second traverse for that EBI in the dictionary (like that used in the second method) is done to find the decoded phrase's character length. After its character length is determined, a displacement position for the partially decoded phrase (still in the buffer) is known (as in the second method), and the buffer content are moved with the last character in the buffer being recorded at that displacement position. Then the remaining characters in the string for the current EBI are decoded in the dictionary in their reverse order and directly recorded in the target area, beginning with the character which overflows the buffer. Accordingly, the third method is more efficient than the second method by eliminating the second scan of the dictionary for each EBI which fits into the buffer.

The fourth method is the preferred method of this invention. It provides a new LGTH field for storing the character length for each phrase represented by a SOI entry in an SOI dictionary. The EBI LGTH (length) field in each SOI entry enables a very efficient decompression expansion process at the expense of a slightly larger decoding dictionary. This LGTH field is put in each entry generated for a SOI dictionary when the dictionary is being generated from a frozen EBI dictionary, and the LGTH field receives a count of the number of characters represented counted for each phrase in the SOI dictionary during its generation process.

While the invention has been particularly shown and described with reference to preferred embodiments thereof, it will be understood by those skilled in the art that various changes in form and details may be made therein without departing from the spirit and scope of the invention.

Having thus described our invention, what we claim as new and desire to secure by Letters Patent is:

1. An improved method of implementing Ziv-Lempel algorithms for compressing/expanding strings of data to improve operating performance of one or more processors in a data processing system executing the Ziv-Lempel algorithms, while maintaining transmission compatibility with conventional adaptive Ziv-Lempel indices for representing compressed data, comprising the data processing steps of:

generating an adaptive Ziv-Lempel (AZL) dictionary from strings of data characters provided from a data base comprised of a large plurality of records, and freezing the AZL dictionary upon reaching a mature state in which the dictionary does not change until and if an unfreeze indication is indicated at a future time;

converting the AZL dictionary to a Storage Optimized Indices (SOI) Dictionary comprising SOI entries which include extension entries, child entries and sibling entries, the SOI entries being located by the SOI indices and extension and child entries containing a representation of corresponding compressed codes consisting of a concatenation of AZL indices, referred to as Evolution-Based-Index (EBI) indices;

inputting to the SOI dictionary a string of characters from any record in the data base, and outputting from the SOI dictionary a sequence of EBIs to represent a compressed form of the record;

transmitting by a transmitter to one or more receivers the EBIs representing the compressed form of the record;

generating an AZL dictionary from received EBIs at each receiver, and freezing the AZL dictionary at each receiver by a signal from the transmitter provided when the transmitter froze its AZL dictionary; and decompressing received EBIs at each receiver using the AZL dictionary generated at the receiver both before and after the AZL dictionary is frozen at the receiver.

2. An improved method of implementing Ziv-Lempel algorithms for compressing/expanding strings of data as defined in claim 1, further comprising the processing steps of:

generating less EBIs than SOIs for the SOI dictionary;

putting a corresponding EBI in each SOI entry except in sibling entries in the SOI dictionary being generated, the sibling entries having no corresponding EBIs; and suspending EBI generation while sibling entries are being generated for the SOI dictionary.

3. An improved method of implementing Ziv-Lempel algorithms for compressing/expanding strings of data as defined in claim 1, further comprising processing steps at a receiver:

expanding each received EBI in the AZL dictionary at the receiver into a corresponding phrase by putting each character decoded in the phrase into a buffer having predetermined space for accommodating all phrase sizes; and moving the phrase in a reverse character order from the buffer to a target storage area in which a transmitted compressed record is being decompressed.

4. An improved method of implementing Ziv-Lempel algorithms for compressing/expanding strings of data as defined in claim 1, further comprising processing steps at a receiver:

tracing in the AZL dictionary at each receiver during an expansion process for each received EBI into a corresponding phrase by counting characters being traced in the phrase to determine a length for the phrase;

expanding the phrase in the AZL dictionary for the received EBI to obtain each character being decoded for the phrase; and moving each characters being decoded for the phrase in a reverse character order from the AZL dictionary into a buffer having space equal or greater than the length determined for the phrase by the tracing step.

5. An improved method of implementing Ziv-Lempel algorithms for compressing/expanding strings of data as defined in claim 1, further comprising processing steps at a receiver:

tracing in the AZL dictionary at each receiver during an expansion process for each received EBI into a corresponding phrase by counting characters being traced in the phrase to determine a length for the phrase;

finding a location in a target storage area at a distance equal to the determined length of the phrase from a last character in a last phrase stored in the area or from the beginning of the area if no prior phrase is stored in the area;

expanding in the AZL dictionary each received EBI into the corresponding phrase to regenerate each character in the phrase; and moving each regenerated character in a reverse character order from the AZL dictionary to the found location in the target storage area in which a transmitted record is being decompressed.

6. An improved method of implementing Ziv-Lempel algorithms for compressing/expanding strings of data as defined in claim 1, further comprising processing steps at a receiver:

expanding each received EBI in the AZL dictionary at the receiver into a corresponding phrase by putting each character decoded in the phrase into a buffer;

detecting if the phrase being expanded exceeds space in the buffer due to the length of the phrase exceeding the space in the buffer;

moving any completed phrase in the buffer in a forward character order from the buffer to an end of a last phrase stored in a target storage area when the detecting step finds the phrase is completed in the buffer;

tracing characters of the phrase in the AZL dictionary for the received EBI and counting the characters being traced to determine a length for the phrase only if the detecting step finds the length of the phrase exceeds the space in the buffer, moving a partial phrase filling the buffer in a reverse character order to a location in a target storage area displaced from a last recorded phrase in the area by the length of the current phrase exceeding space in the buffer, and returning to the expanding step to continue expanding the phrase beginning with the next character not put in the buffer, and again executing the detecting, moving steps until the entire phrase is moved into the target storage area.

7. An improved method of implementing Ziv-Lempel algorithms for compressing/expanding strings of data as defined in claim 1, further comprising processing steps at a receiver:

counting the characters expanded when decompressing the phrase for each received EBI to generate a phrase length value for each decompressed phrase while the AZL dictionary is being generated; and storing the phrase length value in a current entry being generated in the AZL dictionary for each phrase being decompressed.

8. An improved method of implementing Ziv-Lempel algorithms for compressing/expanding strings of data as defined in claim 7, further comprising processing steps at a receiver:

detecting the phrase length value in an AZL dictionary entry accessed at a location determined by a received EBI;

locating a position in a target storage area displaced from a last recorded phrase in the area by the phrase length value;

expanding the received EBI by storing each character decompressed in the AZL dictionary for the EBI into the target storage area in a reverse character order starting at the position located in the target storage area.

* * * * *